United States Patent [19]
Heo

[11] Patent Number: 5,915,169
[45] Date of Patent: Jun. 22, 1999

[54] SEMICONDUCTOR CHIP SCALE PACKAGE AND METHOD OF PRODUCING SUCH

[75] Inventor: Young Wook Heo, Seoul, Rep. of Korea

[73] Assignees: Anam Industrial Co., Ltd.; Amkor Electronics, Inc., both of Seoul, Rep. of Korea

[21] Appl. No.: 08/777,927

[22] Filed: Dec. 23, 1996

[30] Foreign Application Priority Data

Dec. 22, 1995 [KR] Rep. of Korea ........................ 95-54765

[51] Int. Cl.$^6$ .............................. H01L 21/58; H01L 21/60
[52] U.S. Cl. ......................... 438/118; 438/121; 438/125; 438/614; 257/673; 257/690; 257/737; 257/783
[58] Field of Search ................................... 438/613, 614, 438/615, 118, 121, 125, FOR 343, FOR 375; 257/673, 690, 737, 783

[56] References Cited

U.S. PATENT DOCUMENTS

| | | |
|---|---|---|
| 4,825,284 | 4/1989 | Soga et al. . |
| 5,065,227 | 11/1991 | Frankeny et al. . |
| 5,258,648 | 11/1993 | Lin . |
| 5,281,151 | 1/1994 | Arima et al. . |
| 5,311,059 | 5/1994 | Banerji et al. . |
| 5,371,404 | 12/1994 | Juskey et al. . |
| 5,450,283 | 9/1995 | Lin et al. . |
| 5,461,197 | 10/1995 | Hiruta et al. . |
| 5,640,051 | 6/1997 | Tomura et al. . |

*Primary Examiner*—David Graybill
*Attorney, Agent, or Firm*—Skjerven, Morrill, MacPherson, Franklin & Friel LLP; Don C. Lawrence

[57] ABSTRACT

A semiconductor chip scale package and method of producing the package are disclosed. The package has a semiconductor chip having signal leading bumps. A PCB is electrically connected to the chip, thus transmitting input and output signals. A plurality of solder balls are formed on the lower surface of the PCB and are used as signal input and output terminals. An epoxy resin layer bonds the chip to the PCB. The PCB consists of a polymer resin substrate, a copper circuit pattern and a solder mask. The copper circuit pattern has a chip bump land and a solder ball land. The lands electrically connect the signal leading bumps to the solder balls. The package has a package size being similar to or slightly larger than a semiconductor chip within 120 % of the size of the chip.

18 Claims, 3 Drawing Sheets

SEMICONDUCTOR CHIP SCALE PACKAGE AND METHOD OF PRODUCING SUCH

BACKGROUND OF THE INVENTION

1. Field of the Invention

The present invention relates, in general, to a semiconductor chip scale package and method of producing such a package and, more particularly, to an improvement in such a package and method for providing a semiconductor package, with a package size being similar to or slightly larger than a semiconductor chip, without deteriorating the conventionally-expected operational function of the package.

2. Description of the Prior Art

In accordance with the recent trend of compactness, lightness and smallness of semiconductor-electronic appliances such as electronic home appliances, communications appliances and computers, it is necessary to reduce the size and weight of semiconductor packages without deteriorating the operational function of the packages.

However, in known quad flat semiconductor packages, it is very difficult to reduce the plane size or the area of each package due to the outer leads extending from four side surfaces of each package. In an effort to overcome the problem caused by the known quad flat packages, BGA (ball grid array) semiconductor packages are proposed and used. Known BGA packages reduce the size of packages by about 20% in comparison with the known quad flat packages. However, the known BGA packages are problematic in that the size or area of each package is several times as large as the area of a semiconductor chip used in the package. Therefore, the known BGA packages regrettably fail to completely achieve the recent trend of compactness, lightness and smallness of semiconductor-electronic appliances.

In order to overcome the problems caused by the known quad flat and BGA packages, a flip chip package with a reduced size is proposed. The known flip chip packages more effectively reduce the size of the packages in comparison with the other types of known packages as they are produced through a flip chip mounting process. An example of a typical flip chip package is shown in FIG. 6. As shown in this drawing, the flip chip mounting process of forming a flip chip package is processed as follows. That is, a plurality of bumps 31 are formed on the bond pad (not shown) which is positioned on the top surface of a semiconductor chip 10. After forming the bumps 31 on the bond pad, the bond pad with the bumps 31 is turned over prior to welding the bumps 31 to the copper pattern 203 of a printed circuit board 200 at a position where the pattern 203 is free from a solder mask 202 and is thereby exposed to the atmosphere. Thereafter, an epoxy resin 40 fills in the junction between the chip 10 and the pattern 203, with the bumps 31 being set in the resin 40, thus forming a flip chip package. In the flip chip package, the bumps 31 electrically connect the bond pad of the chip 10 to a plurality of solder balls 30 through the copper pattern 203. The solder balls 30, which are spaced apart from the chip 10 by predetermined distances, are used as signal input and output terminals of the package. In FIG. 6, the reference numeral 201 denotes a polymer resin substrate of the PCB 200.

However, the known flip chip packages are problematic in that they are remarkably larger than the semiconductor chips used in them thus failing to achieve the recent trend of compactness, lightness and smallness of semiconductor-electronic appliances.

SUMMARY OF THE INVENTION

It is, therefore, an object of the present invention provides a semiconductor chip scale package in which the above problems can be overcome and which has a package size being similar to or slightly smaller than 120% of the size of the chip, without deteriorating the conventionally-expected operational function of the package.

Another object of the present invention provides a method of producing the above semiconductor chip scale package.

The above objects of this invention are achieved by forming the solder balls, which are used as signal input and output terminals of a package, on the lower surface of a semiconductor chip and by using a copper circuit pattern in the electrical connecting of the chip to the solder balls.

In an embodiment, the semiconductor chip scale package comprises: a semiconductor chip having signal leading bumps; a printed circuit board (PCB) bonded to the lower surface of the chip and electrically connected to the chip, thus transmitting input and output signals to or from the chip; a plurality of solder balls formed on the lower surface of the PCB and used as signal input and output terminals of the package; and an epoxy resin layer bonding the chip to the PCB. The PCB comprises a polymer resin substrate, a copper circuit pattern and a solder mask. The copper circuit pattern includes a chip bump land and a solder ball land which electrically connect the signal leading bumps of the chip to the solder balls.

In another embodiment, the PCB comprises two or more polymer resin substrates and two or more copper circuit patterns alternately layered on each other and a solder mask formed on the top surface of the PCB. The copper circuit patterns neighbor on each other and are electrically connected together through a via thus causing the solder balls to commonly have a power signal and/or a ground by connection of one of the signal leading bumps.

In the present invention, the method for producing a semiconductor chip scale package, comprises the steps of: forming a copper circuit pattern on one side of a polymer resin substrate; forming a bump seating opening by forming a solder mask on the one side of the substrate except for a position where a signal leading bump of a semiconductor chip is to be welded to the copper circuit pattern; forming a solder ball seating opening on the opposite side of the substrate; welding the bump of the chip into the bump seating opening; filling a gap between the chip and the solder mask with epoxy resin prior to hardening the epoxy resin; and welding a solder ball into the solder ball seating opening.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
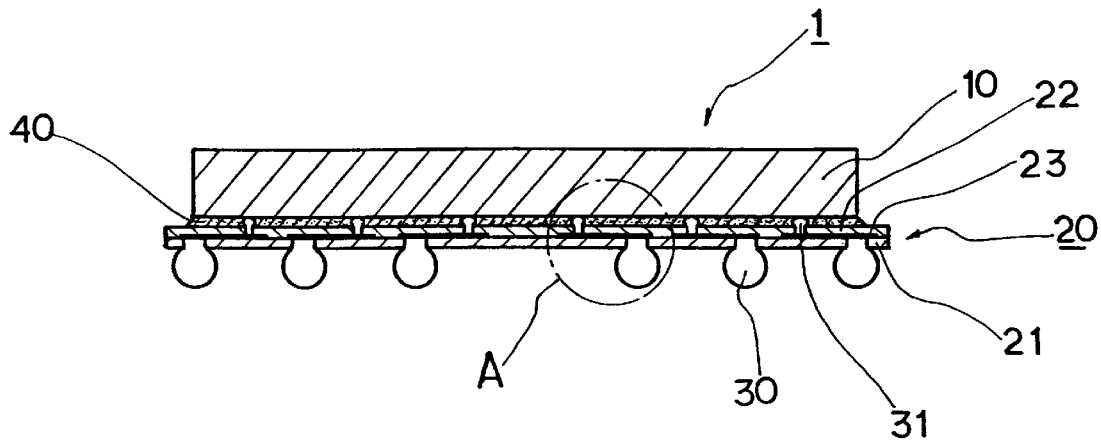
FIG. 1 is a side sectional view showing the construction of a semiconductor chip scale package in accordance with the primary embodiment of the present invention.
Figure 2:
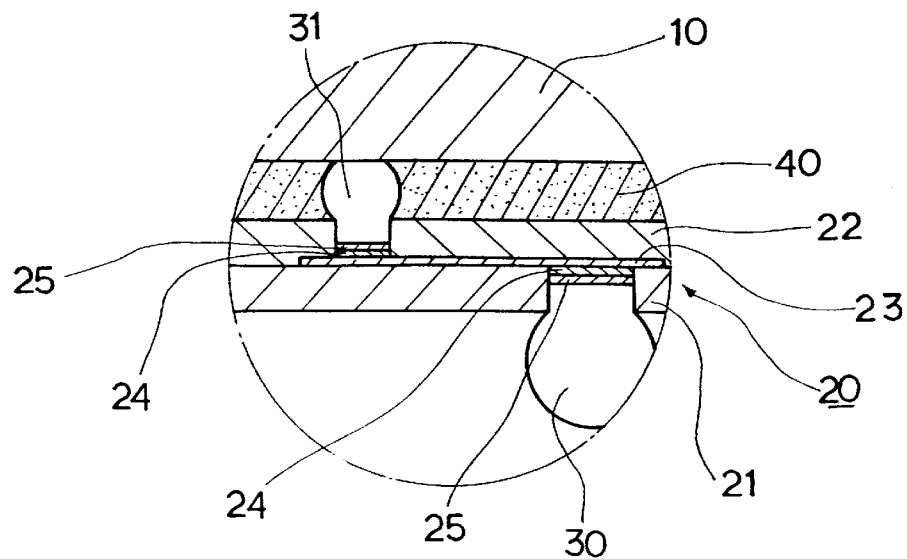
FIG. 2 is an enlarged sectional view showing the construction of the portion "A" of FIG. 1.

FIG. 1 is a side sectional view showing the construction of a semiconductor chip scale package in accordance with the primary embodiment of this invention. FIG. 2 is an enlarged sectional view showing the construction of the portion "A" of FIG. 1. As shown in the drawings, the package 1 of this invention includes a semiconductor chip 10 having signal leading bumps. A PCB (printed circuit board) 20 is bonded to the lower surface of the chip 10 and is electrically connected to the chip 10, thus transmitting input and output signals to or from the chip 10. A plurality of solder balls 30 are formed on the lower surface of the PCB 20 and are used as signal input and output terminals of the package. The package 1 also includes an epoxy resin layer 40 which bonds the chip 10 to the PCB 20. The above package 1 is free from a breakable bond wire which is typically used as an electric connection means in a typical semiconductor package, so that it is unnecessary to envelope the package 1 using a plastic material and this allows the recent trend of compactness and smallness of the packages to be effectively achieved.

The PCB 20 comprises a polymer resin substrate 21, a copper circuit pattern 23 and a solder mask 22 in a conventional manner.

In the present invention, the polymer resin of the substrate 21 may be selected from a group of various highmolecular polymers, preferably, polyimide resins and bismaleimide triazine resins, most preferably, polyimide resins. While forming the substrate 21, the polyimide resins may be formed into a single or multi-layered structure. The solder mask 22 may be selected from the group of thin films, which are made of various insulating polymer resins, preferably epoxy or polyimide thin films.

It is possible to freely form the copper circuit pattern 23 in accordance with the use and operational function of a resulting package. In the package 1 of this invention, the copper circuit pattern 23 includes two types of lands: a chip bump land 27 and a solder ball land 26. The two lands 26 and 27 are used for electrically connecting the bumps 31, which are welded to the bond pad (not shown) of the semiconductor chip 10, to the solder balls 30 in the package 1. The detailed construction and operation of the two types of lands 26 and 27 will be described later herein with reference to FIGS. 3A, 3B, 4A and 4B.

The semiconductor chip scale package 1 of this invention is produced as follows. That is, a copper circuit pattern 23 is primarily formed on a polymer resin substrate 21, which is made of, for example, a polyimide resin, in a conventional manner thus forming a printed circuit board (PCB) 20. In this circuit board forming step, a copper thin film is layered on one surface of the polymer resin substrate 21. A photoresist dry film is formed on the above copper thin film prior to positioning a photo mask on the photo-resist dry film. The positioning of the photo mask on the photo-resist dry film is followed by the imaging of the copper circuit pattern 23, the radiating of ultraviolet rays and the etching of the pattern 23.

The circuit board forming step is followed by a step of forming a plurality of bump seating openings 29 on the copper circuit pattern 23 of the PCB 20. In order to form the bump seating openings 29 on the pattern 23, a solder mask 22 is formed on the one surface of the substrate 21 except for positions where the bumps 31, which are formed on the bond pad (not shown) of the chip 10, are to be welded to the copper circuit pattern 23 as shown in FIGS. 3B and 4B. After the step of forming the bump seating openings 29, a plurality of solder ball seating openings 28 are formed on the opposite surface of the substrate 21. The solder ball seating openings 28 are formed on the substrate 21 by partially removing the polymer resin from the substrate 21 as shown in FIGS. 3B and 4B. The step of forming the solder ball seating openings 28 is followed by a step of seating the bumps 31 of the chip 10 in the respective bump seating openings 29. In the bump seating step, a surface active agent such as rosin flux is applied to the copper circuit pattern 23 in the bottom of the bump seating openings 29 prior to seating the chip 10 onto the solder mask 22. The PCB 20 with the chip 10 in turn passes through a high temperature oven or furnace, so that the bumps 31 formed on the bond pad of the chip 10 are thermally deformed and welded into the respective bump seating opening 29. After the step of seating bumps 31 in the openings 29, the remaining surface active agent is removed from the pattern 23 through a deflux process. Thereafter, the gap, which is formed in the junction of the chip 10 and the solder mask 22 of the PCB 20, is filled with epoxy resin 40 prior to hardening the resin 40 at a high temperature of higher than 100° C. The package producing process of this invention is ended by welding the solder balls 30 into the solder ball seating openings 28 of the PCB 20.

FIG. 2 shows the detailed construction of the portion "A" of FIG. 1. That is, FIG. 2 shows not only the copper circuit pattern 23 which electrically connects the chip 10 to the solder balls 30 used as signal input and output terminals of the package 1, it also shows the connection structure between the bumps 31 and solder balls 30.

The PCB 20 comprises the polymer resin substrate 21, the copper circuit pattern 23, which is formed on the substrate 21, and the solder mask 22 which is formed on the pattern 23. In the PCB 20, the bumps 31 electrically connect the bond pad (not shown) of the chip 10 to the top surface of the copper circuit pattern 23, while the solder balls 30 are electrically connected to the bottom surface of the pattern 23. Therefore, the input and output signals of the chip 10 are transmitted through the solder balls 30. In the above package 1, the solder balls 30, which are used as the signal input and output terminals, are formed on the lower surface of the chip 10, so that the size of the package is effectively reduced and thereby reduces the area of the package.

The bumps 31, which are formed on the bond pad of the chip 10, may be made of Au, Sn/Pb solder or an alloy of Au and Sn/Pb solder. Alternatively, the bumps 31 may be formed into bumps used in a conventional wafer process. The semiconductor chip 10 with the bumps 31 is seated on the PCB 20 in a way such that the bumps 31 are aligned with the bump seating openings 29 respectively as shown in FIGS. 3B and 4B. In the package 1 of this invention, the solder balls 30 may be made of Au, Sn/Pb solder or an alloy of Au and Sn/Pb solder in the same manner as described for the bumps 31.

The epoxy resin 40 fills in the gap, which is formed in the junction of the chip 10 and the solder mask 22, and in turn is hardened at a high temperature. The epoxy resin 40 not only tightly attaches the chip 10 to the PCB 20, it also protects the bumps 31.

In the package 1 of this invention, an Ni coating layer 24 may be formed on the bottom of each of the bump and solder ball seating openings 29 and 28. In addition, an Au coating layer 25 may be formed on the Ni coating layer 24 thus improving conductivity of the bottoms of the openings 28 and 29. In this case, the Au coating layer 25 has a thickness of higher than 0.2 $\mu$, preferably higher than 0.3 $\mu$, so that the layer 25 has an excellent conductivity. The Ni coating layer 24, which protects the surface of the copper circuit pattern 23 exposed to each opening 28, 29, has a thickness of higher than 1 $\mu$, preferably higher than 3 $\mu$. Of course, it should be understood that the above coating layers 24 and 25 are not compulsorily formed on the package 1 and in the package producing process of this invention. That is, the layers 24 and 25 may be selectively formed on the package 1.

Figure 3A:
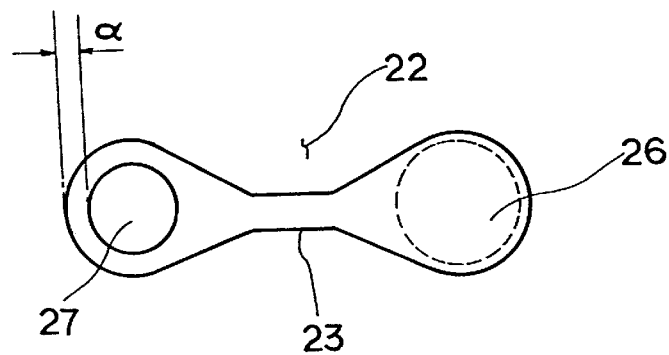
FIGS. 3A and 3B are plan and sectional views showing the configuration and construction of a copper circuit pattern in accordance with an embodiment of the present invention, which is provided with a chip bump land and a solder ball land for electrically connecting the semiconductor chip to the solder balls in the package.
Figure 3B:
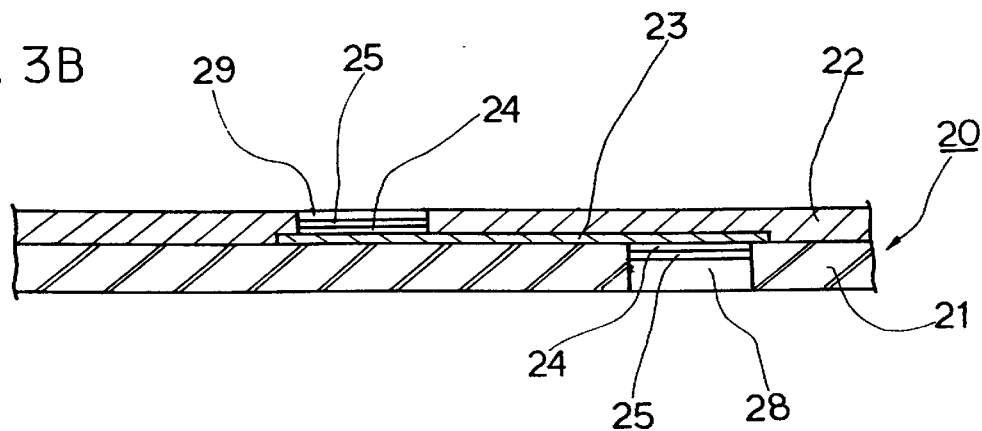
Figure 4A:
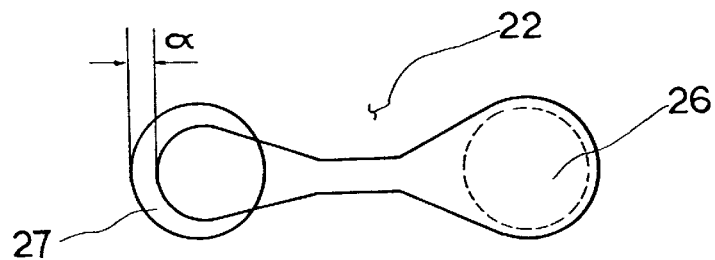
FIGS. 4A and 4B are plan and sectional views showing the configuration and construction of a copper circuit pattern in accordance with another embodiment of the present invention, which is provided with a chip bump land and a solder ball land for electrically connecting the semiconductor chip to the solder balls in the package.
Figure 4B:
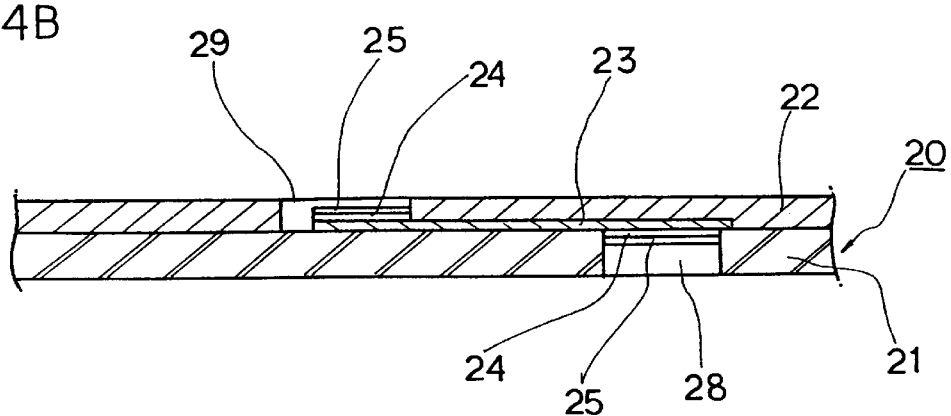

FIGS. 3A and 3B show the configuration and construction of a copper circuit pattern in accordance with an embodiment of this invention. FIGS. 4A and 4B show the configuration and construction of a copper circuit pattern in accordance with another embodiment of this invention. As shown in the drawings, the copper circuit pattern 23 of this invention is provided with a chip bump land 27 and a solder ball land 26 for electrically connecting the semiconductor chip 10 to the solder balls 30.

As shown in FIGS. 3A and 4A, the copper circuit pattern 23, which electrically connects the chip 10 to the solder balls 30, has a flat dumbbell configuration. The chip bump land 27 is formed on the top surface of one end of the pattern 23, while the solder ball land 26 is formed on the bottom surface of the other end of the pattern 23. However, it should be understood that the copper circuit pattern of this invention may have another configuration in place of the above-mentioned flat dumbbell configuration if the resulting pattern electrically connects the chip 10 to the solder balls 30 without failure.

As shown in FIGS. 3B and 4B, the bump seating openings 29 are formed by the solder mask 22 which is formed on the substrate 21 except for positions where the bumps 31 are to be welded to the copper circuit pattern 23. Meanwhile, the solder ball seating openings 28 are formed on the substrate 21 by partially removing the polymer resin from the substrate 21. While forming the solder ball seating openings 28, the polymer resin of the substrate 21 may be removed through an etching process. Alternatively, the polymer resin may be removed from the substrate 21 by radiating a laser beam onto the substrate 21. As a further alternative, the solder ball seating openings 28 may be formed on the substrate 21 by punching the substrate 21 prior to forming the copper circuit pattern 23 on the substrate 21.

In the copper circuit pattern 23 shown in FIGS. 3A and 3B, the chip bump land 27 is formed on the top surface of one end of the copper circuit pattern 23 at a position corresponding to the bottom of each bump seating opening 29 formed by the solder mask 22. That is, the chip bump land 27 is defined inside each bump seating opening 29. The above land 27 is located on a position which is spaced apart inward from the outside edge of the circuit pattern 23 by a distance ($\alpha$) greater than 0.05 mm. As described above, the Ni and Au coating layers 24 and 25 may be formed on the chip bump land 27 inside each bump seating opening 29. Meanwhile, the solder ball land 26 is formed on the bottom surface of the other end of each solder ball seating opening 28, which is formed by partially removing the polymer resin from the substrate 21. The Ni and Au coating layers 24 and 25 may be formed on the solder ball land 26 inside each solder ball seating opening 28 in the same manner as described for the chip bump land 27. Therefore, the bottom of the bump seating opening 29 is electrically connected to the bottom of the solder ball seating opening 28.

In the copper circuit pattern 23 shown in FIGS. 4A and 4B, the chip bump land 27 is formed on the top surface of one end of the copper circuit pattern 23 at a position corresponding to the bottom of each bump seating opening 29 formed by the solder mask 22. That is, the chip bump land 27 is defined inside each bump seating opening 29. The above land 27 includes not only one end of the copper circuit pattern 23, but also includes an arcuate section of the top surface of the substrate 21 which is exposed to the bump seating opening 29 at a position around the rounded end of the copper circuit pattern 23. In the chip bump land 27, the distal end of the copper circuit pattern 23 is spaced apart from the side wall of the bump seating opening 29 by a distance ($\alpha$) greater than 0.05 mm. As described above, the bump seating opening 29 is formed on the copper circuit pattern 23, with the arcuate section of the substrate 21 being exposed to the bump seating opening 29 at a position around the rounded end of the copper circuit pattern 23. On the bottom of the bump seating opening 29, the arcuate section of the substrate 21 is exposed to the bump seating opening 29, while the Ni and Au coating layers 24 and 25 may be formed on the copper circuit pattern 23 inside the bump seating opening 29. Therefore, the chip bump land 27 or the bottom of the bump seating opening 29 is stepped as best seen in FIG. 4B. Meanwhile, the solder ball land 26 is formed on the bottom of the solder ball seating opening 28, which is formed on the bottom surface of the copper circuit pattern 23. The solder ball land 26 is formed in the same manner as described for the solder ball land of FIGS. 3A and 3B and further explanation is thus not deemed necessary. Therefore, the bottom of the bump seating opening 29 is electrically connected to the bottom of the solder ball seating opening 28.

Figure 5:
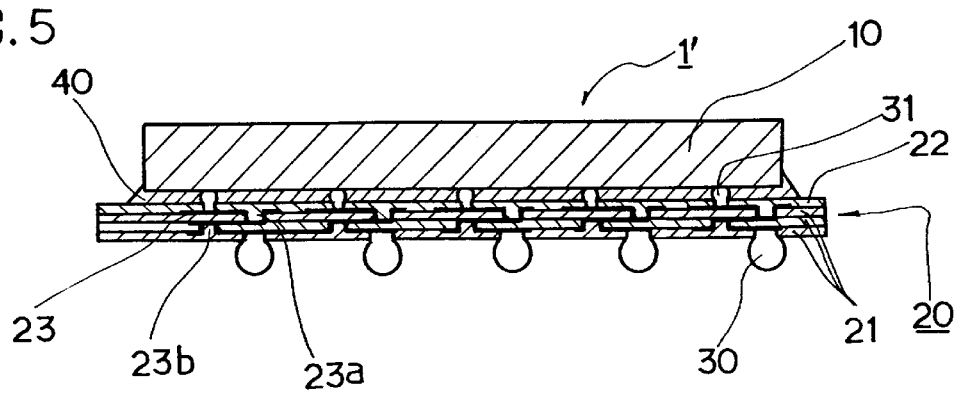
FIG. 5 is a side sectional view showing the construction of a semiconductor chip scale package in accordance with the second embodiment of the present invention.
Figure 6:
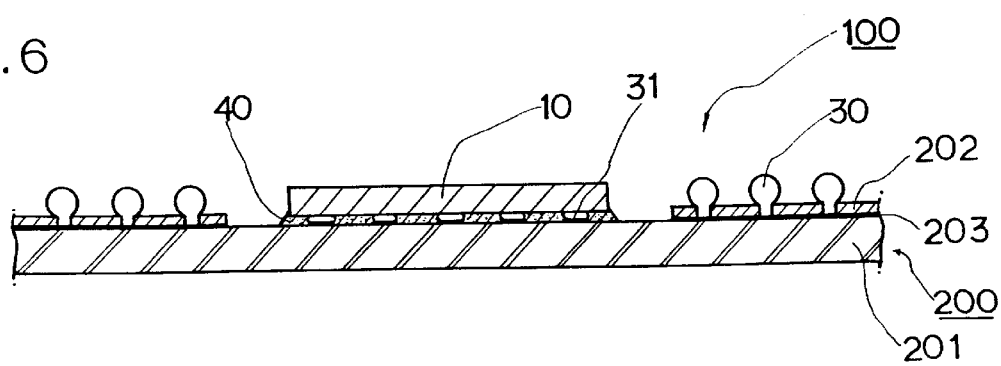
FIG. 6 is a side sectional view showing the construction of a known flip chip package.

FIG. 5 is a side sectional view showing the construction of a semiconductor chip scale package in accordance with the second embodiment of the present invention. In the second embodiment, the general shape of the package 1' remains the same as in the primary embodiment of FIG. 1, but a plurality of, for example, two polymer resin substrates 21 and a plurality of, for example, two copper circuit patterns 23 are alternately layered on each other. Therefore, only the difference between the two embodiments will be described hereinbelow with reference to FIG. 5.

In the package 1', the PCB 20 comprises two or more polymer resin substrates 21 and two or more copper circuit patterns 23 are alternately layered on each other. A solder mask 22 is formed on the top surface of the PCB 20. The copper circuit patterns 23, which neighbor on each other, are electrically connected together through both a buried via 23*a* and a blind via 23*b*. Therefore, a plurality of solder balls 30 in the package 1' commonly have a power signal and/or a ground by connection of one bump 31.

As described above, the present invention provides a semiconductor chip scale package and method of producing such a package. The package of this invention has a package size being similar to or slightly smaller than 120% of the size of the chip, without deteriorating the conventionally-expected operational function of the package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor chip scale package comprising:
   a semiconductor chip having signal leading bumps;
   a printed circuit board (PCB) bonded to the lower surface of the chip and electrically connected to the chip, thus transmitting input and output signals to or from the chip;
   a plurality of solder balls formed on the lower surface of said PCB and used as signal input and output terminals of the package;
   an epoxy resin layer bonding said chip to the PCB; and
   said PCB comprising a polymer resin substrate, a copper circuit pattern and a solder mask, said copper circuit pattern including a chip bump land and a solder ball land, said lands electrically connecting said signal leading bumps of the chip to said solder balls.

2. The package according to claim 1, wherein said PCB comprises:
   two or more polymer resin substrates and two or more copper circuit patterns alternately layered on each other;
   a solder mask formed on the top surface of the PCB; and
   said copper circuit patterns neighboring on each other and being electrically connected together through a via thus causing the solder balls to commonly have a power signal and/or a ground by connection of one of said signal leading bumps.

3. The package according to claim 1 or 2, wherein said package has an area of not larger than 120% of the size of said semiconductor chip.

4. The package according to claim 1 or 2, wherein said chip bump land and solder ball land are commonly formed on one copper circuit pattern in such as manner that: the chip bump land is defined on the copper circuit pattern on the bottom of a bump seating opening formed by said solder mask; and said solder ball land is defined on the copper circuit pattern on the bottom of a solder ball seating opening formed by partially removing the polymer resin from said substrate.

5. The package according to claim 4, further comprising an Ni coating layer formed on each of said lands and an Au coating layer formed on said Ni coating layer.

6. The package according to claim 5, wherein each of said Ni and Au coating layers has a thickness of higher than 0.3 $\mu$.

7. The package according to claim 4, wherein said chip bump land is formed on the top surface of one end of the copper circuit pattern inside the bump seating opening and is located on a position spaced apart inward from the outside edge of the copper circuit pattern by a distance greater than 0.05 mm, while said solder ball land is formed on the bottom surface of the other end of said copper circuit pattern inside the solder ball seating opening.

8. The package according to claim 4, wherein said chip bump land is formed on the top surface of one end of the copper circuit pattern inside the bump seating opening and on an arcuate section of the top surface of said substrate exposed to the bump seating opening at a position around the end of the copper circuit pattern, with the distal end of said copper circuit pattern being spaced apart from the side wall of the bump seating opening by a distance greater than 0.05 mm, while said solder ball land is formed on the bottom surface of the other end of said copper circuit pattern inside the solder ball seating opening.

9. The package according to claim 1 or 2, wherein said signal leading bumps are made of Au, Sn/Pb solder or an alloy of Au and Sn/Pb solder.

10. A method for producing a semiconductor chip scale package, comprising the steps of:
    forming a copper circuit pattern on one side of a polymer resin substrate;
    forming a bump seating opening by forming a solder mask on the one side of the substrate except for a position where a signal leading bump of a semiconductor chip is to be welded to the copper circuit pattern;
    forming a solder ball seating opening on the opposite side of said substrate;
    welding the bump of the chip into said bump seating opening;
    filling a gap between the chip and the solder mask with epoxy resin prior to hardening said epoxy resin; and
    welding a solder ball into said solder ball seating opening.

11. The method according to claim 10, wherein the step of forming a copper circuit pattern comprises the steps of:
    alternately arranging two or more polymer resin substrates and two or more copper circuit patterns on each other; and
    electrically connecting said copper circuit patterns together through a via, thus causing a plurality of solder balls to commonly have a power signal and/or a ground by connection of said signal leading bump.

12. The method according to claim 10 or 11, wherein said package has an area of not larger than 120% of the size of said semiconductor chip.

13. The method according to claim 10 or 11, wherein said solder ball seating opening is formed through an etching or laser radiating process.

14. The method according to claim 10 or 11, wherein said solder ball seating opening is formed by punching said substrate prior to forming the copper circuit pattern.

15. The method according to claim 10 or 11, wherein an Ni coating layer is formed on the bottom of each of said seating openings and an Au coating layer is formed on said Ni coating layer, thus forming a chip bump land and a solder ball land during the steps of forming the seating openings.

16. The method according to claim 15, wherein each of said Ni and Au coating layers has a thickness of higher than 0.3 $\mu$.

17. The method according to claim 15, wherein said chip bump land is formed on the top surface of one end of the copper circuit pattern inside the bump seating opening and is located on a position spaced apart inward from the outside edge of the copper circuit pattern by a distance greater than 0.05 mm, while said solder ball land is formed on the bottom surface of the other end of said copper circuit pattern inside the solder ball seating opening.

18. The package according to claim 15, wherein said chip bump land is formed on the top surface of one end of the copper circuit pattern inside the bump seating opening and on an arcuate section of the top surface of said substrate exposed to the bump seating opening at a position around the end of the copper circuit pattern, with the distal end of said copper circuit pattern being spaced apart from the side wall of the bump seating opening by a distance greater than 0.05 mm, while said solder ball land is formed on the bottom surface of the other end of said copper circuit pattern inside the solder ball seating opening.

* * * * *